United States Patent [19]

Honda et al.

[11] Patent Number: 5,545,353
[45] Date of Patent: Aug. 13, 1996

US005545353A

[54] NON-CORROSIVE PHOTORESIST STRIPPER COMPOSITION

[75] Inventors: Kenji Honda, Barrington; Taishih Maw, Cumberland, both of R.I.

[73] Assignee: OCG Microelectronic Materials, Inc., Norwalk, Conn.

[21] Appl. No.: 436,548

[22] Filed: May 8, 1995

[51] Int. Cl.$^6$ .................. C11D 7/32; C11D 7/50; G03C 5/00; G03C 11/12
[52] U.S. Cl. .................. 510/176; 252/391; 252/394; 252/395; 430/331; 510/202; 510/212; 510/255; 510/262; 510/480
[58] Field of Search .................. 252/153, 158, 252/542, 544, 545, 546, 548, 171, 391, 394, 395; 430/256, 329, 331

[56] References Cited

U.S. PATENT DOCUMENTS

| | | | |
|---|---|---|---|
| 4,617,251 | 10/1986 | Sizensky et al. | 430/256 |
| 4,770,713 | 9/1988 | Ward | 134/38 |
| 4,786,578 | 11/1988 | Neisius et al. | 430/256 |
| 4,824,762 | 4/1989 | Kobayashi et al. | 430/258 |
| 4,824,763 | 4/1989 | Lee | 430/258 |
| 4,904,571 | 2/1990 | Miyashita et al. | 430/331 |
| 5,260,357 | 11/1993 | Sachdeva | 523/414 |
| 5,279,791 | 1/1994 | Lee | 252/548 |
| 5,304,252 | 4/1994 | Condra et al. | 134/2 |
| 5,308,745 | 5/1994 | Schwartzkopf | 430/329 |
| 5,334,332 | 8/1994 | Lee | 252/548 |
| 5,417,877 | 5/1995 | Ward | 252/153 |
| 5,433,773 | 7/1995 | Harelstad | 106/14.13 |

FOREIGN PATENT DOCUMENTS

| | | |
|---|---|---|
| 1225404 | 8/1987 | Canada . |
| D. 3828513 | 3/1990 | Germany . |
| 56-115368 | 9/1981 | Japan . |
| 63-208043 | 8/1988 | Japan . |
| 1-081949 | 3/1989 | Japan . |
| 64-088548 | 4/1989 | Japan . |
| 4-124668 | 4/1992 | Japan . |
| 4-350660 | 12/1992 | Japan . |
| 5-045894 | 2/1993 | Japan . |

*Primary Examiner*—Linda S. Therkorn
*Attorney, Agent, or Firm*—William A. Simons

[57] ABSTRACT

A non-corrosive photoresist composition containing:

(a) 20–70% by weight of an organic polar solvent having a dipole moment of more than 3.5;

(b) 70–20% by weight of selected amine compounds;

(c) 0.1–10% by weight of (2-benzothiozolylthio)succinic acid.

7 Claims, No Drawings

NON-CORROSIVE PHOTORESIST STRIPPER COMPOSITION

BACKGROUND OF THE INVENTION

1. Field of the Invention

The present invention relates to a noncorrosive photoresist stripper composition containing the combination of (1) selected solvents; (2) selected amines; and (3) a selected corrosion inhibitor.

2. Description of the Prior Art

The photoresist stripper art is replete with numerous references to stripper compositions containing both a polar solvent and an amine compound. The presence of an amine in photoresist stripper compositions has been judged to be essential to effectively remove cross-linked resist films. However, amine-type photoresist strippers sometimes have a serious problem of corrosion, especially with aluminum substrates.

It is believed that the corrosion is caused in part by the ionization of water with the amine in post-stripping water rinse, as residual stripper solution may be retained on the substrate surface and/or substrate carrier after the stripping step. In other words, the amine component of the stripper composition does not corrode the substrate by itself, but can trigger water to cause the corrosion.

To solve this problem, an intermediate rinse step with an organic solvent has been used between the stripping step and the post-stripping rinse with water. For example, isopropyl alcohol is known to be useful for this purpose. However, such intermediate rinses are not necessarily desirable because overall stripping operation becomes more complicated and, furthermore, an additional solvent waste is produced. Accordingly, if amine-type strippers are to be further employed, there is a need to solve this corrosion problem without intermediate organic solvent wastes. The present invention provides such a solution.

Illustrative of references suggesting photoresist stripper compositions containing the combination of a polar solvent and an amine compound are the following:

1. U.S. Pat. No. 4,617,251, which issued to Sizensky et al. (Olin Hunt) on Oct. 14, 1986, teaches a positive photoresist stripping composition containing (A) selected amine compound (e.g., 2-(2-aminoethoxy)-ethanol; 2-(2-aminoethylamino)-ethanol; and mixtures thereof) and (B) selected polar solvents (e.g., N-methyl-2-pyrrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

2. U.S. Pat. No. 4,770,713, which issued to Ward (J. T. Baker) on Sep. 13, 1988, teaches a positive photoresist stripping composition containing (A) a selected amide (e.g., N,N-dimethyl acetamide; N-methyl acetamide; N,N-diethyl acetamide; N,N-dipropyl acetamide; N,N-dimethyl propionamide; N,N-diethyl butyramide and N-methyl-N-ethyl propionamide) and (B) selected amine compound (e.g., monoethanolamine, monopropanolamine, methyl-aminoethanol). The patent also teaches this stripper may optionally contain a water miscible nonionic detergent (e.g., alkylene oxide condensates, amides and semi-polar nonionics).

3. U.S. Pat. No. 4,786,578, which issued to Neisius et al. (Merck) on Nov. 22, 1988, teaches a rinse solution used after a photoresist stripper, said rinse solution containing (A) a nonionic surfactant (e.g., ethoxylated alkylphenol, fatty and ethoxylate, fatty alcohol ethoxylate or ethylene oxide/propylene oxide condensate) and (B) an organic base (e.g., mono-, di-, or tri-ethanolamine).

4. U.S. Pat. No. 4,824,762, which issued to Kobayashi et al. on Apr. 25, 1989, teaches photoresist stripping post-rinse solution containing (A) glycol ether (e.g., diethylene glycol monomethyl ether, dipropylene glycol monomethyl ether, tripropylene glycol monomethyl ether) and (B) an aliphatic amine (e.g., monoethanolamine or triisopropylamine).

5. U.S. Pat. No. 4,824,763, which issued to Lee (EKC) on Apr. 25, 1989, teaches positive-working photoresist stripping composition containing (A) triamine (e.g., diethylenetriamine) and (B) a polar solvent (e.g., N-methyl-2-pyrrolidone, dimethylformamide, butyrolactone, aliphatic hydrocarbons, aromatic hydrocarbons, chlorinated hydrocarbons).

6. U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium amines, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridane borone, tert-butyl amine borone, triethyl amine borone, and morpholine borone).

7. U.S. Pat. No. 5,279,791, which issued to Lee (EKC) on Jan. 18, 1994, teaches a stripping composition for removing resists from substrates containing (A) hydroxylamine (e.g., $NH_2OH$); (B) at least one alkanolamine; and optionally (C) at least one polar solvent.

8. U.S. Pat. No. 5,334,332, which issued to Lee (EKC) on Aug. 2, 1994, teaches the use of ethylenediamine tetraacetic acid and 1,2-dihydrobenzene as a chelating reagent to reduce the surface metal contamination on wafers.

9. German Published Patent Application No. DE3828513, which issued to Schulz (Merck) on Mar. 1, 1990, teaches a positive and negative photoresist stripper composition containing (A) an aprotic polar solvent (e.g., 1,3-dimethyl-2-imidazolidinone or 1,3-dimethyl-tetrahydro-pyrimidinone); and (B) an organic base (e.g., alkanolamine).

10. Japanese Published Patent Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

11. Japanese Published Patent Application No. 63-208043, which issued to R. Ohtani (Kanto Chemical) on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)-ethanol, triethylene(tetramine). The application also teaches a surfactant may be added to the stripper.

12. Japanese Published Patent Application No. 64-088548, which issued to S. Shiotsu (Nagase Denshi Kagaku) on Apr. 3, 1989, teaches the use of 2-butyne-1,4-diol as a corrosion inhibitor for a positive photoresist stripper.

13. Japanese Published Patent Application No. 1-081949, which issued to K. Matsumoto (Asahi Chemical) on Mar. 28, 1989, teaches a positive-working photoresist stripper composition containing (A) gamma-butyrolactone, N-methylformamide, N,N-dimethylformamide, N,N-dimethyl-acetoamide or Nmethylpyrrolidone; (B) an amino alcohol (e.g., N-butyl-ethanolamine and N-ethyldiethanolamine); and (C) water.

14. Japanese Published Patent Application No. 4-124668, which issued to K. Wakiya (Tokyo Ohka) on Apr. 24, 1992, teaches the use of a phosphoric acid group containing surfactant as a corrosion inhibitor in a photoresist stripper.

15. Japanese Published Patent Application No. 4-350660, which issued to H. Goto (Texas Instruments, Japan and Kanto Chemical, Inc.) on Dec. 4, 1992, teaches a stripper for positive photoresists comprising (A) 1,3-dimethyl-2-imidazolidinone (DMI), (B) dimethylsulfoxide (DMSO) and (C) a water-soluble amine (e.g., monoethanolamine or 2-(2-amino-ethoxy)ethanol wherein the amount of the water-soluble amine is 7–30% by weight.

16. Japanese Published Patent Application No. 5-045894, which issued to Ward (ACT, Inc.) on Feb. 26, 1993, teaches the use of 6-hydroxyquinoline as a corrosion inhibitor in a positive photoresist stripper.

None of these references suggest the addition of such a chelating type corrosion inhibitor that has a divalent or polyvalent carboxylic acid group and is readily soluble in organic solvents such as N-methylpyrrolidone, N,N'-dimethyl-2 imidazolidinone, or related cyclic amides. Ethylenediamine tetraacetic acid (EDTA), which is one of typical polyvalent carboxylic acid-containing chelating reagents, was disclosed as a stripper ingredient in U.S. Pat. No. 5,334,332, which issued to Wai M. Lee on Aug. 2, 1994, however, EDTA or its analogues have least solubility in such organic solvents that are usually used in the stripper formulation so that they cannot well perform especially in order to prevent the corrosion.

BRIEF SUMMARY OF THE INVENTION

The present invention, therefore, is directed to a resist stripper composition comprising:

(a) from about 20 to about 70% by weight of an organic polar solvent having a dipole moment of more than 3.5;

(b) from about 70 to about 20% by weight of an amine compound selected from the group consisting of compounds having the formula (I):

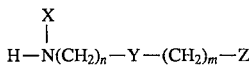
(I)

wherein n and m are each independently an integer ranging from 0–5, inclusive; X is hydrogen, alkyl, or alkoxy group; Y is either —O— or —NH—; and Z is hydrogen, —OH, or —NH$_2$; (c) from about 0.1 to about 10% by weight of (2-benzothiazolylthio)-succinic acid.

DESCRIPTION OF THE PREFERRED EMBODIMENTS

As stated above, the non-corrosive stripper of the present invention has three critical components, namely:

(a) a polar solvent having a dipole moment of more than 3.5;

(b) an amine;

(c) (2-benzothiazolylthio) succinic acid.

The solvent used in this stripper composition should have a good solubility for cross-linked resist films. In other words, the solvent is necessary to efficiently remove cross-linked resist films which are strongly adhering to the substrate.

The solvent should thus meet the following criteria:

(1) Its dipole moment should be more than 3.5.

(2) Its boiling point should be more than 130°–180° C.

(3) Its flash point should be more than 60°–90° C.

Among various candidates, amides are particularly preferred. In particular, cyclic amides such as N-alkyl-2-pyrrolidones (e.g., N-methyl-2-pyrrolidone (NMP)), N-hydroxyethyl-2-pyrrolidone) and 1,3-dialkyl-2-imidazolidinones are especially preferable from a view point of stripping power and toxicity. A suitable solvent mixture may be an admixture of N-hydroxyethyl-pyrrolidone (HEP) and 1,3-dimethyl-2imidozolidinone (DMI) wherein the mixing ratio of HEP:DMI is from about 95:5% to about 5:95% by weight as HEP is a known safer solvent and DMI is a powerful stripping solvent.

As mentioned above, another major component of the stripper is an amine compound. Alkanolamines are particularly preferable. But an amine cannot efficiently dissolve cross-linked resist films by itself, probably because of its high viscosity.

Various amines can be used in the stripper composition of this invention. Particularly, amines having at least one hydroxyl group, so-called alkanolamines, are the most preferable; for example, monoethanolamine, 2-(2-aminoethoxy)ethanol, 2-(2-aminoethylamino)ethanol, and the like.

The third essential component of the stripper composition of this invention is (2-benzothiazolylthio)succinic acid working as a corrosion inhibitor. This compound has the following chemical formula:

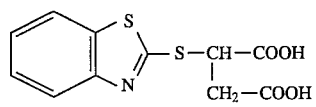

It is commercially available from Ciba-Geigy Ltd. as IRGACOR 252. It is known to work as a corrosion inhibition in the area of paints but never tested in the area of the photoresist stripper.

It has firstly been found that this compound can effectively inhibit corrosion without any damage of the stripping power of the claimed amines. This component is superior to other known corrosion inhibitors in that it has a good balance of the various functional and economic requirements, namely, the following:

(a) excellent prevention of metal contamination of substrate surfaces;

(b) favorable material cost for the desired corrosion inhibition effect.

The preferred amounts of these ingredients are about 40–65% polar solvent; about 25–60% amine compound; and about 0.2–5% corrosion inhibitor; all based on the weight of the stripper composition.

Optionally, it-may be desirable to add a novolak resin having a weight-average molecular weight ($M_w$) from about 200 to about 5,000 to the compositions of the present invention. Such novolak resins have unexpectedly been found to reduce the particle and metal levels at the substrate surface.

Any type of novolak resin structure within the above molecular weight range is believed to be suitable. Preferably, the novolak may be any addition-condensation product of one or more monomeric phenols (e.g., phenol, o-cresol, m-cresol, p-cresol, 2,3-xylenol, 2,5-xylenol, 3,5-xylenol, 2,3,5-trimethylphenol, and admixtures thereof) with a suitable aldehyde source, e.g., formaldehyde, paraformaldehyde, benzaldehyde, actaldehyde, or mixtures thereof.

Preferably, the amount of novolak resin added may be from about 0.01 to about 1%.

Various other ingredients known to those skill in the art may optionally be included in the stripping composition e.g. dyes or colorants, wetting agents, surfactants, antifoamers and so forth. Generally, the amount of each of these optional ingredients would be about 0.1–0.5% by weight, based on the total stripper composition The described stripping composition is used in removing an organic polymeric material from a substrate. The method of the invention is carried out by contacting an organic polymeric material with the described stripping composition. The actual conditions, i.e., temperature, time, and the like, may vary over wide ranges and are generally dependent on the nature and thickness of the organic polymeric material to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material with the stripping composition in the practice of the invention. For example, the substrate containing the organic polymeric material can be immersed in a stripping bath or the stripping composition can be sprayed over the surface of the organic polymeric material, as will be apparent to those skilled in the art.

The stripper composition of the invention is effective in removing a wide variety of organic polymeric materials from substrates. Exemplificative organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol formaldehyde resins or poly(p-vinylphenol); negative resists containing cyclized polyisoprene or poly(p-vinylphenol); and polymethylmethacrylate-containing resists. In particularly preferred embodiments of the invention, the stripping composition has been found to be highly effective in removing positive resists containing a novolak resin and a diazo ketone sensitizer, e.g., ortho naphthoquinone diazide sulfonic acid ester; resists of this type include HPR 204 Series POSITIVE RESIST, HPR 504 Series POSITIVE RESIST, 0iR32 Series POSITIVE RESIST, and HPR 6500 Series POSITIVE RESIST, all available commercially from OCG Microelectronic Materials, Inc. The organic polymeric material can be removed from any of the conventional substrates known to those skilled in the art, such as silicon, silicon dioxide, silicon nitride, polysilicon, aluminum, aluminum alloys, copper, copper alloys, polyimides, and so forth.

The present invention is further described in detail by means of the following Example and Comparison. All parts and percentages are by weight and all temperatures are degrees Celsius unless explicitly stated otherwise.

EXAMPLE

Silicon wafers, 125 mm in diameter, were used for the following stripping tests which were carried out at 90° C. for 10 minutes in a quartz tank without recirculation or filtration. After the processing, the wafers were immediately rinsed with deionized water in an overflow tank for 10 minutes at room temperature and spun dry.

The stripping efficiency was determined by measuring the amount of residues left on the wafers after the removal of a photoresist film casted with a stripper solution which consists of N-methyl-2-pyrrolidone (NMP), 50 g, 2-(2-aminoethoxy)ethanol (AEE), 50 g, and Irgacor 252 obtained from Ciba-Geigy, 1.1 g at 1.0 wt. % to the total stripper weight. For this measurement, OCG positive i-line photoresist, 0iR32, was spun coated on the wafers, exposed, developed, and hard baked at 150° C. for 15 minutes. The remaining residues on the wafers after the stripping were detected as Light Point Defect (LPD) with a Censor ANS100 light scattering equipment. LPD's which are bigger than 0.15 micron in diameter were measured as residual LPD to evaluate the stripping efficiency.

The corrosion of Al/Cu/Si alloy was evaluated on blanket layers. The change in the sheet resistance of the blanket layers was measured by 4 point probe. The corrosion parameter, $\Delta t$, was calculated by using the following equation:

$$\Delta t = P \left( \frac{1}{Rs(B)} - \frac{1}{Rs(A)} \right)$$

where P is the resistivity of the metal film in ohm-cm, Rs(B) is the sheet resistance in ohm/square before the stripping, and Rs(A) is the sheet resistance in ohm/square after the stripping.

The results are summarized in Table 1 in comparison with Reference 1 in which NMP/AEE (50:50) admixture was used without any additive. This result indicates that the addition of Irgacor to the stripper composition results in a significant reduction of the corrosion without any degradation of the stripping efficiency.

TABLE 1

|  | Residual LPD (#/wafer) | Corrosion Parameter $\Delta t$ (nm) |
| --- | --- | --- |
| Example 1 | 2,000 | 10 |
| Reference 1 | 1,000 | 70 |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A photoresist stripper composition comprising:
   (a) from about 20 to about 70% by weight of an organic polar solvent having a dipole moment of more than 3.5;
   (b) from about 70 to about 20% by weight of an amine compound selected from the group consisting of an alkanolamine compound within the formula (I):

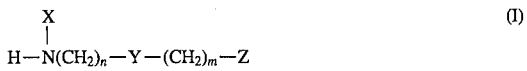

wherein n and m are each independently an integer ranging from 0–5, inclusive; X is hydrogen, alkyl, or alkoxy group; Y is either —O— or —NH—; and Z is hydrogen, —OH, or —NH$_2$;

(c) from about 0.1 to about 10% by weight of (2-benzothiozolylthio)succinic acid; all percents based on the weight of the stripper composition.

2. The stripper composition of claim 1 wherein said solvent (a) is a cyclic amide.

3. The stripper composition of claim 2 wherein said cyclic amide is selected from the group consisting of N-alkyl-2-pyrrolidone, N-hydroxyalkyl-2-pyrrolidone, and 1,3-dialkyl-2-imidazolidinone.

4. The stripper composition of claim 1 wherein said alkanolamine is selected from the group consisting of monoethanolamine, 2-(2-aminoethoxy)ethanol and 2-(2-aminoethylamino)ethanol, diethanolamine, and triethanolamine.

5. The stripper composition of claim 2 wherein said alkanolamine is selected from the group consisting of monoethanolamine, 2-(2-aminoethoxy) ethanol, diethanolamine, and triethanolamine.

6. The stripper composition of claim 3 wherein said alkanolamine is selected from the group consisting of monoethanolamine, 2-(2-aminoethoxy) ethanol, diethanolamine and triethanolamine.

7. The stripper composition of claim 3 wherein said N-alkyl-2-pyrrolidone is N-methyl-2-pyrrolidone.

* * * * *